United States Patent [19]

Watakabe et al.

[11] Patent Number: 4,792,461

[45] Date of Patent: Dec. 20, 1988

[54] METHOD OF FORMING A PHOTOMASK MATERIAL

[75] Inventors: Yaichiro Watakabe; Shuichi Matsuda, both of Itami, Japan

[73] Assignee: Mitsubishi Denki Kabushiki Kaisha, Tokyo, Japan

[21] Appl. No.: 64,392

[22] Filed: Jun. 22, 1987

Related U.S. Application Data

[62] Division of Ser. No. 837,356, Mar. 6, 1986.

[30] Foreign Application Priority Data

Aug. 30, 1985 [JP] Japan .................... 60-192814

[51] Int. Cl.$^4$ ............................ B05D 3/06
[52] U.S. Cl. ...................... 427/38; 428/91; 430/5
[58] Field of Search ............ 427/38, 91; 430/5

[56] References Cited

U.S. PATENT DOCUMENTS

| | | | |
|---|---|---|---|
| 4,661,426 | 4/1987 | Matsuda et al. | 430/296 |
| 4,678,714 | 7/1987 | Watakabe | 428/432 |

FOREIGN PATENT DOCUMENTS

| | | |
|---|---|---|
| 73136 | 8/1981 | European Pat. Off. . |
| 157247 | 9/1982 | Japan . |
| 157249 | 9/1982 | Japan . |
| 82/00794 | 8/1981 | PCT Int'l Appl. . |

*Primary Examiner*—Edith Buffalow
*Attorney, Agent, or Firm*—Lowe, Price, LeBlanc, Becker & Shur

[57] ABSTRACT

A silicide film of oxidized transition metal 3 formed on a transparent substrate 1 has a low reflectance and in consequence, a high resolution can be obtained and dry etching thereof can be easily done. In addition, since said silicide film 3 has good adhesion to a transparent substrate 1, file patterns therein do not peel off at the time of rinsing the mask.

10 Claims, 1 Drawing Sheet

METHOD OF FORMING A PHOTOMASK MATERIAL

This is a division, of application Ser. No. 837,356 filed 3-6-86.

BACKGROUND OF THE INVENTION

1. Field of the Invention

This invention relates to a photomask material and particularly to a photomask material to be used for manufacturing a semiconductor device.

2. Description of the Prior Art

As a mask to be used for manufacturing a semiconductor device, a photograghic emulsion plate formed by a glass substrate was generally utilized in the early days. However, according to the tendency toward high integration with fine patterns, hard masks including a metallic thin film of a material such as chromium (Cr) formed on a transparent glass substrate are widely utilized these days (for example, see Japanese Patent Laying-Open Gazette No. 157247/1982 or No. 157249/1982).

FIG. 2 is a sectional view of a conventional photomask material. In the figure, a metal film 2 of chromium or the like is formed on a transparent glass substrate 1 of quartz or the like. This metal film 2 of Cr or the like is formed to a thickness of approximately 600 to 800 Å on the transparent glass substrate 1 by an evaporation or sputtering process. In order that a photomask for semiconductor device may be obtained, photoresist or resist for an electron beam (referred to hereinafter as EB) is coated on the metal film 2 and patterns are formed by irradiation of light or EB, and after that, a developing process and an etching process etc. are applied. If the metal film 2 is formed of Cr, etching is applied by using ceric antimony nitrate and perchloric acid in a wet process or a mixed gas of carbon tetrachloride ($CCl_4$) and oxygen ($O_2$) in a dry process. In manufacturing of a mask for a semiconductor device, particularly a highly integrated device having fine patterns such as VLSI, a dry etching process which produces little side etching is preferred.

Although a wet etching process is generally adopted for manufacturing a Cr mask to be used as a mask for manufacturing a conventional semiconductor device, it is difficult in a wet etching process to obtain a mask of high precision due to a side etching effect and the like, while in a dry etching process, the etching speed of Cr is lower than approximately 100 Å/min and a ratio of selection of resist is not appropriate and, therefore, the dry etching process is not suited for mass production of photomasks. In addition, in the case of a Cr mask, adhesion to the quartz substrate is not good, causing fine patterns to peel off at the time of rinsing the mask.

As one solution to the above stated problems, a method might be considered in which a metal silicide film formed by a silicide transition metal of molybdenum (Mo), tantalum (Ta), tungsten (W) or the like is used as a mask material (for example, see Japanese Patent Application No. 61372/1984). More specifically, silicon (Si) contained in the quartz glass substrate and silicon (Si) contained in the metal silicide film as a mask material are effectively combined to produce strong adhesion. As for etching, dry etching can be easily done (at an etching speed of 1000 Å/min) by using a mixed gas plasma containing carbon tetrafluoride ($CF_4$) and oxygen ($O_2$), compared with the case of a chromium (Cr) mask.

However, the above stated transition metal silicide film has a light reflection factor as high as approximately 50% and as a result, at the time of pattern printing, the resolution of the patterns is decreased due to diverse scattering of light between the wafer and the mask, which makes it difficult to manufacture a VLSI device having submicron patterns.

SUMMARY OF THE INVENTION

An object of this invention is to provide a photomask material of high quality having an excellent adhesive property with respect to a transparent substrate and a low reflection factor, dry etching thereof being easily performed.

Briefly stated, the present invention includes a transparent substrate and a silicide film of oxidized transition metal formed on the transparent substrate.

According to the present invention, a silicide film of oxidized transition metal formed on the transparent substrate has a low reflectance and in consequence, a high resolution can be obtained and dry etching can be easily done. In addition, since said silicide film has good adhesion to a transparent substrate, fine patterns do not hardly peel off during rinsing of the mask.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
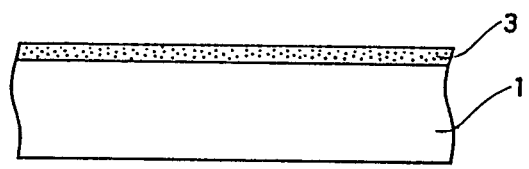
FIG. 1 is a sectional view showing a photomask material of an embodiment of this invention.
Figure 2:
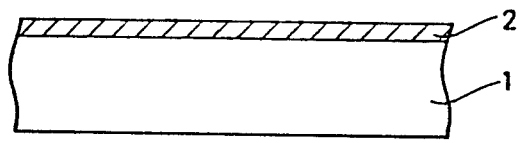
FIG. 2 is a sectional view of a conventional photomask material.

FIG. 1 is a sectional view showing a photomask material of an embodiment of this invention. In the figure, a silicide film 3 of oxidized transition metal such as molybdenum (Mo), tungsten (W) or tantalum (Ta) is formed to a thickness of approximately 1000 Å on a substrate 1 of transparent glass such as quartz. Such an oxidized transition metal silicide film (referred to hereinafter as oxidized metal silicide film) 3 can be formed easily by a sputtering process or the like. For example, if sputtering is applied to molybdenum silicide ($MoSi_2$) as a target by plasma containing Argon (Ar) gas and oxygen ($O_2$) gas mixed in any suitable ratio, molybdenum oxide silicide film ($MoSi_2O_x$), in which $MoSi_2$ and $O_2$ are combined in a suitable ratio can be obtained. For example, if the value of x (where x is an oxygen index) is intended to be "0.1", $O_2$ gas in a proportion of of 2 to 5% is added to Ar gas. Otherwise, a molybdenum oxide silicide film may be formed by sputtering an Ar plasma using a target of molybdenum oxide silicide formed in advance by a suitable ratio. As the value x in $MoSi_2O_x$ increases, the reflection factor is lowered, but the film gradually becomes insulated. In manufacturing a mask by means of electron beam (EB), as a problem of charging up does not arise, it is necessary to control the value x so that the resistance of the molybdenum oxide silicide film may be lower than several $K\Omega$. For example, if x is lower than 0.1, the reflection factor becomes lower than 30% and the resistance becomes several $K\Omega$ and thus, favorable conditions are established. In addition, since reflection of light is particularly intense on the surface of the film, $O_2$ may be controlled so that the concentration of x may be increased near the surface. On the other hand, in case of the printing by irradiation of light, since there is no problem of charging up, the oxidized metal silicide film 3 may be a complete insulator. Concretely, x may be about "1".

Thus, if an oxidized metal silicide film is used as a mask material as described above, the reflection factor is much lowered as compared with a conventional case using an ordinary metal silicide film as a mask material and, consequently, lowering of the resolution of patterns due to diffused reflection can be avoided. Furthermore, the silicide oxidized metal has good adhesion to a transparent substrate ($SiO_2$, $Al_2O_3$ etc.), particularly a quartz glass substrate, and has the merit that the lifetime of the photomask is lengthened (in other words, fine patterns will not peel off at the time of rinsing the mask).

In addition, the oxidized metal silicide film 3 can be easily etched in a dry etching process. For example, in the case of molybdenum oxide silicide, mixed gas of $CF_4 + O_2$ (2%) or $CCl_4 + O_2$ is used and under the conditions of a degeee of vacuum of 0.2 Torr and 300 W, etching is completed at an etching speed of approximately 500 Å/min. At this time, the molybdenum oxide silicide film ($MoSi_2O_x$) is volatilized, leaving reaction products such as $MoOCl_4$ or $SiOCl_4$. The etching speed in this case is approximately five times as fast as the dry etching speed in a conventional Cr film and, therefore, it is understood that such fast etching speed is suited for mass production of photomasks. Prior to the dry etching process, photoresist or EB resist is coated to a thickness of 4000 to 6000 Å on the oxidized metal silicide film 3 and then patterns are printed on the transparent glass substrate 1 by irradiation of light or EB. In this case, a problem of charging up does not arise even in the case of using EB, since the oxidized metal silicide film 3 has conductivity of several K as described above.

As described in the foregoing, according to this invention, a silicide film of oxidized transition metal is formed on a transparent substrate. In consequence, patterns of high resolution can be formed and dry etching can be easily done at a high etching speed. Thus, a photomask material having high reliability can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a photomask material on a transparent substrate, suitable for use in manufacturing a semiconductor device, comprising the steps of:
    depositing on said transparent substrate a film of a silicide of an oxidized transition metal.
2. A method according to claim 1, wherein:
    said transition metal comprises a member of a group of metals including molybdenum, tantalum and tungsten.
3. A method according to claim 1 wherein:
    said transparent substrate comprises quartz glass.
4. A method according to claim 1, wherein:
    said transparent substrate comprises sapphire.
5. A method according to claim 1, wherein:
    said film has a thickness of approximately 1000 Å.
6. A method according to claim 1, wherein:
    said depositing step comprises sputtering of said sllicide of an oxidized transition metal by a plasma.
7. A method according to claim 1, wherein:
    said depositing step comprises sputtering of said silicide of an oxidized transition metal by an argon gas plasma.
8. A method according to claim 6, wherein:
    said plasma contains argon (Ar) gas and oxygen ($O_2$2) in a predetermined ratio.
9. A method according to claim 8, wherein:
    said ratio of Ar to $O_2$ in said plasma is within the range 20:1 to 50:1.
10. A method according to claim 8, wherein:
    said ratio of Ar to $O_2$ in said plasma is selected such that the deposited film of said silicide of an oxidized transition metal has a composition defined by $MSi_2O_x$, wherein x is in the range 0.1 to 1 and M represents a transition metal selected from a group that includes molybdenum, tantalum and tungsten.

* * * * *